United States Patent [19]

Schlegl

[11] Patent Number: 5,436,592
[45] Date of Patent: Jul. 25, 1995

[54] MODULATOR HAVING ENCODER FOR FAULT-ADAPTIVE PULSE STEP MODULATION

[75] Inventor: William S. Schlegl, Quincy, Ill.
[73] Assignee: Harris Corporation, Melbourne, Fla.
[21] Appl. No.: 268,260
[22] Filed: Jun. 29, 1994
[51] Int. Cl.⁶ .............................................. M03F 3/38
[52] U.S. Cl. ...................................... 330/10; 332/106
[58] Field of Search ...................... 330/10, 207 A, 251; 332/106, 115

[56] References Cited

U.S. PATENT DOCUMENTS

| | | | |
|---|---|---|---|
| 4,403,197 | 9/1983 | Swanson | 330/10 |
| 4,560,944 | 12/1985 | Furrer | 330/10 |
| 5,249,201 | 9/1993 | Posner et al. | 332/106 X |

Primary Examiner—Steven Mottola
Attorney, Agent, or Firm—Tarolli, Sundheim & Covell

[57] ABSTRACT

An improved pulse step modulator (PSM) is presented herein for use in an AM transmitter. The modulator includes a plurality of unit step modules connected together in series with each module including a DC voltage source together with an associated actuatable switch for, when actuated, turning on the associated module to provide a unit step voltage. An output circuit is connected to the series connected modules for providing an output voltage to a load wherein the magnitude of the output voltage is equal to the sum of all of the voltage sources of the modules that are turned on. A plurality of module turn on signals are provided with each turn on signal serving to actuate one of the switches in one of the modules with the number of turn on signals being provided being dependent upon the magnitude of the input signal. The turn on signals are provided by circuitry including an addressable memory and addressing means. The memory has a plurality of addressable storage locations each including a number of turn on signals. The addressing means addresses one of the storage means in the memory dependent upon the magnitude of the input signal to obtain from the address storage means the stored pattern of turn on signals.

22 Claims, 12 Drawing Sheets

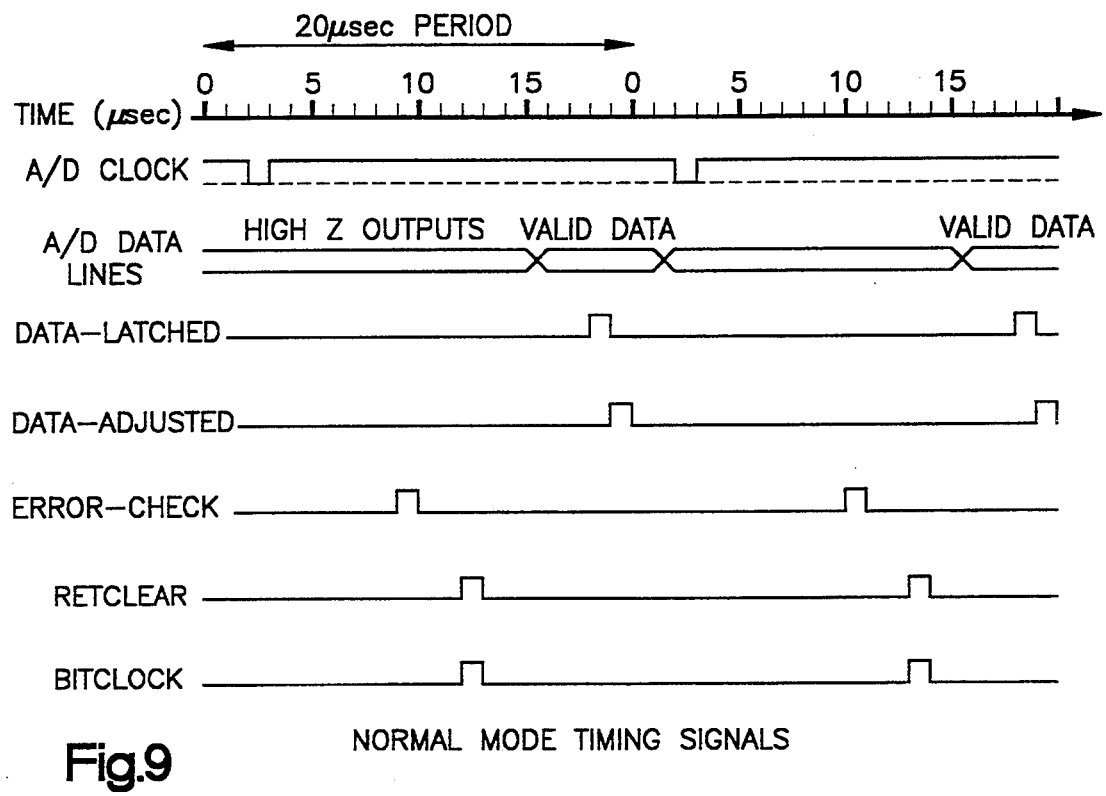
Fig.9 NORMAL MODE TIMING SIGNALS
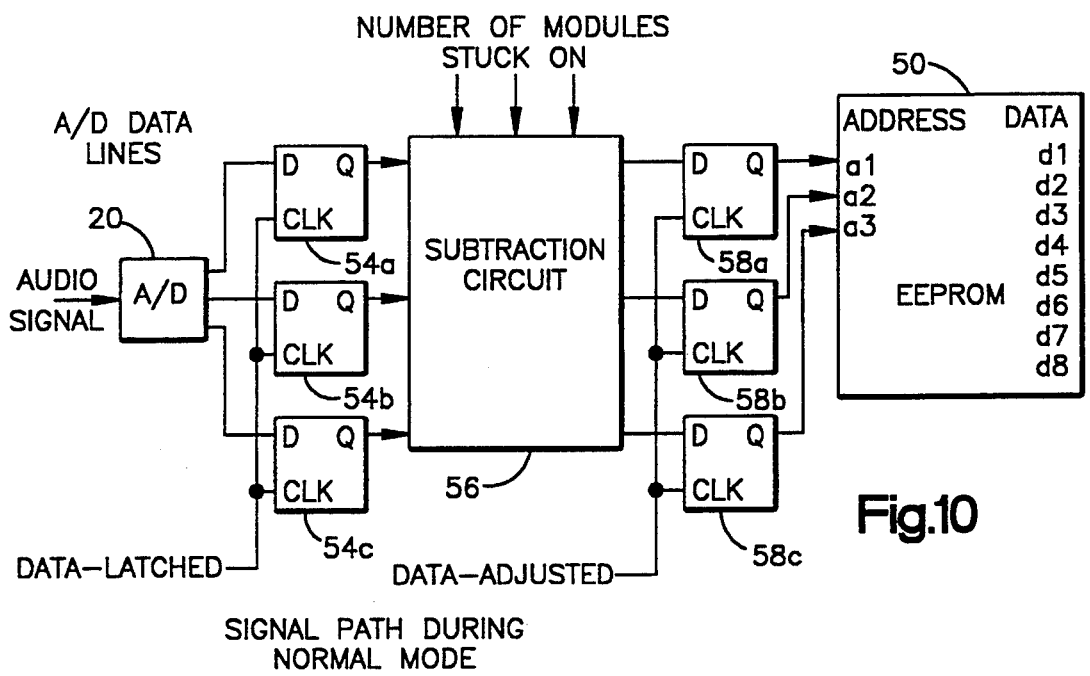
Fig.10
SIGNAL PATH DURING NORMAL MODE

MODULATOR HAVING ENCODER FOR FAULT-ADAPTIVE PULSE STEP MODULATION

FIELD OF THE INVENTION

This invention relates to the art of modulators and, more particularly, to pulse step modulators which are particularly applicable for use in AM radio broadcasting systems.

DESCRIPTION OF THE PRIOR ART

In AM radio broadcasting in the medium-wave and shortwave bands, a high-power vacuum tube is conventionally used in the final radio frequency amplifier stage of the transmitter. For maximum power-amplification efficiency, this tube is not operated as a linear amplifier, but rather as a class C or class D biased circuit, producing an RF envelope which follows that of the B+ DC supply voltage provided to the tube anode. Thus, modulation of the RF signal is achieved through varying the B+ DC supply to the plate anode of the tube. The high-powered audio amplification circuitry required to vary this voltage is referred to in the art as the modulator.

Recently, a modulator to achieve the foregoing has been employed in the art and is known as a pulse step modulator (PSM). Such a pulse step modulator is disclosed in U.S. Pat. No. 4,403,197 to H. I. Swanson. A pulse step modulator (PSM) as disclosed in that patent includes a plurality of series connected unit step modules each of which includes an isolated DC voltage source, a remotely controlled switch and a series diode. The switch in each module may be remotely controlled to turn the module on or off. As each module is turned on, it provides a step voltage. As the various modules are turned on in a stepwise fashion, the output voltage will increase in steps from 0 volts to a maximum voltage with the maximum equalling the sum of all of the module DC voltage sources. A lowpass filter at the output may be employed for removing switching noise. An encoder or the like monitors a time varying input signal, such as an audio signal, and turns on one of the unit step modules for each incremental increase in the value of the audio signal. As the audio signal continues to increase in value, the modules are turned on one at a time in a given order. Similarly, as the audio signal decreases in value, the modules are sequentially turned off in the reverse order.

The U.S. Pat. No. to A. Furrer 4,560,944 also discloses a pulse step modulator similar to that as described above. This patent, however, employs a monitor for monitoring the operation of the various unit step modules for purposes of controlling the modulator. Specifically, the circuit serves to provide a first on-first off operation of the various modules. Thus, as the input signal increases in magnitude, the module that has been turned off for the longest will be the first to be turned on. Conversely, as the input signal decreases in magnitude, the module that has been turned on the longest will be the first to be turned off.

SUMMARY OF THE INVENTION

In accordance with the invention, a modulator is provided having a plurality of modules each including a signal source, such as a DC voltage source, and an associated actuatable switch which, when actuated, turns on the associated module to provide a unit signal, such as a step voltage. An output circuit is connected to the modules for providing an output signal to the load wherein the magnitude of the output signal is equal to the sum of all of the signal sources of the modules that are turned on. A plurality of turn on signals are provided with each serving to actuate one of the switches in one of the modules so that the number of turn on signals is dependent upon the magnitude of the input signal. The means for providing the turn on signals includes an addressable memory having a plurality of addressable storage means each containing a pattern of turn on signals. Addressing circuitry serves to address one of the storage means in the memory dependent upon the magnitude of the input signal to obtain from the storage means the pattern of turn on signals.

In accordance with a more limited aspect of the present invention, circuitry is provided for rewriting the memory to change the number of turn on signals stored in the addressable memory locations.

In accordance with a still further aspect of the present invention, circuitry is provided for monitoring the operation of the various modules for fault conditions and rewriting the memory to reflect the number of faults detected.

BRIEF DESCRIPTION OF THE DRAWINGS

The foregoing and other objects and advantages of the invention will become more readily apparent from the following description as taken in conjunction with the accompanying drawings, wherein:

FIG. 9 includes graphical waveforms of voltage with respect to time useful in explaining the invention;

FIG. 10 is a schematic-block diagram illustration illustrating signal path during the normal mode of operation;

DESCRIPTION OF A PREFERRED EMBODIMENT

Figure 1:
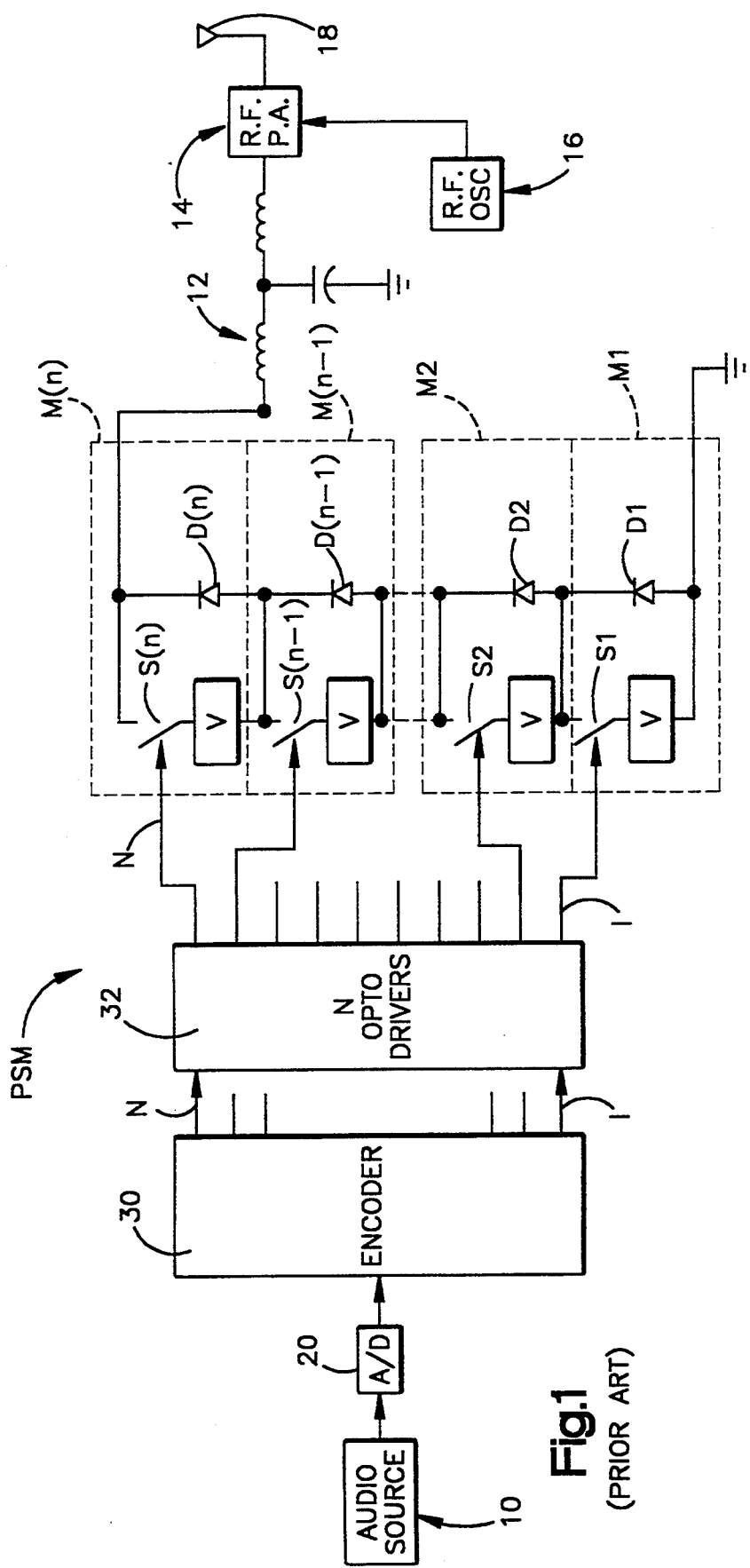
FIG. 1 is a schematic-block diagram illustration of a prior art AM broadcasting transmitter employing a pulse step modulator (PSM)

Reference is now made to the drawings wherein the showings are for purposes of illustrating a preferred embodiment of the invention only and not for purposes of limiting same. FIG. 1 illustrates an AM transmitter which incorporates a pulse step modulator (PSM). The transmitter includes an audio source 10 which generates an amplitude and frequency varying audio signal which is to be amplified and transmitted. This signal is supplied by way of a conventional analog-to-digital converter 20 to a pulse step modulator (PSM). The pulse step modulator, to be described in greater detail hereinafter, amplifies the signal to a high power level and provides a resulting amplitude signal $V_{out}$ to a low pass filter 12. The resulting amplified and filtered signal is then supplied to the audio input of a conventional RF power amplifier 14 where it amplitude modulates an RF carrier signal supplied by an RF oscillator 16. The resulting AM signal is then transmitted by a conventional antenna 18.

The analog-to-digital converter 20 receives the analog audio signal from the audio source 10 and converts it into a multi-bit digital representation thereof. For example, the analog input signal may be converted into a 12 bit digital signal. The six most significant bits are supplied to a decoder 30 having N output circuits which are supplied to an optical driver circuit 32. Circuit 32 has N output circuits respectively connected to N unit step switches S1 through SN. Switches S1 through SN are respectively located in unit step modules M1 through M(N).

The encoder 30 sequentially energizes its output circuits 1 through N with incremental increases in the magnitude of the analog signal and de-energizes the output circuits in the reverse order with incremental decreases in the magnitude of the analog signal. These are reflected through the optical driver circuit 32. The optical driver circuit has output circuits 1 through N which serve to sequentially close switches S1 through SN as the analog input signal incrementally increases in magnitude and to sequentially open the switches, in the reverse order, as the input analog signal incrementally decreases in magnitude. Whenever a switch S1 through SN is open, the associated unit step module is turned off and whenever a switch is closed, the associated unit step module is turned on.

Each unit step module M1 through M(N) includes an incremental unit step voltage source V, a switch such as switch S1 and a diode such as diode D1 all interconnected as shown with respect to module M1 in FIG. 1. The unit step modules are connected together in series with diodes D1 through D(N). Each incremental voltage source may be considered as a DC voltage source of a fixed magnitude which, in practice, may be on the order of 600 volts. The total voltage across the series connected modules is dependent upon the number of modules which have been turned on by closure of the associated switches S1 through S(N). For example, if all of the switches S1 through SN are closed, then all of the unit step voltage sources V are connected together in series and added together to provide an output voltage NV. If each unit step voltage source V has a value on the order of 600 volts and N is on the order of 50, then the total voltage may be on the order of 30,000 volts.

Figure 2A:
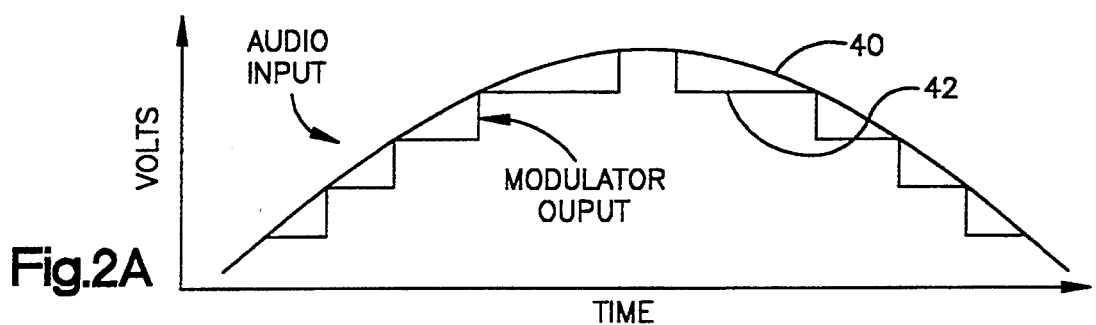
FIG. 2 includes FIGS. 2A and 2B which are graphical waveforms of voltage with respect to time useful in explaining the background of the invention.
Figure 2B:
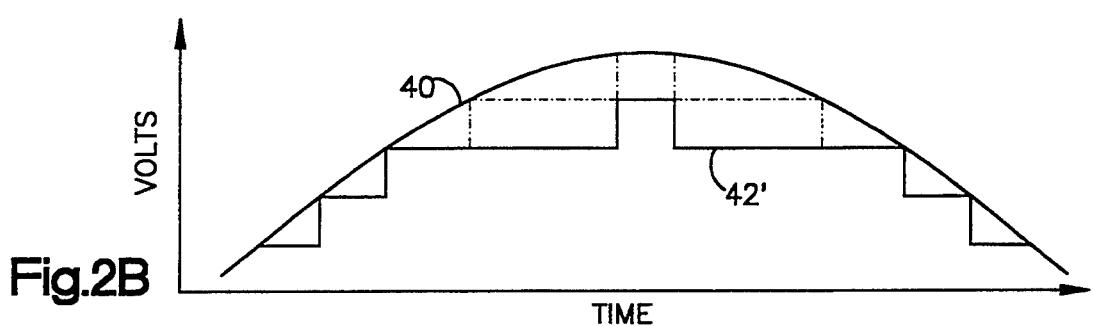

The switches associated with the unit step modules must be capable of handling such a voltage and the ensuing current. Consequently, these switches, in practice, take the form of IGBT or GTO transistor switches. If a switch fails, distortion will result in the output voltage. Reference is now made to FIG. 2A which illustrates an audio input voltage 40 which represents an input signal obtained from an audio source 10 and wherein the input signal is an amplitude and frequency varying signal which is to be amplified and transmitted. Superimposed on the input signal 40 there is illustrated an output modulator voltage 42 which is a step voltage and which increases and decreases in incremental step voltages with increasing and decreasing values of the input signal 40. For purposes of simplification, no amplification is illustrated in these waveforms. FIG. 2B is similar to that of FIG. 2A but shows the modulator output voltage 42' as it results when one of the unit step modules has failed in an off condition. This results in a distorted output waveform and will remain distorted even after being passed by the filter 12.

The present invention is directed toward an improved pulse step modulator (PSM) system that incorporates an improved encoder and means for controlling the encoder over those illustrated in FIG. 1. The encoder 30 of FIG. 1 provides a plurality of turn on signals on its outputs 1 through N in accordance with the number of modules M1 through M(n) are to be turned on. The number is determined by the magnitude of the output from the analog-to-digital converter and which, in turn, depends upon the magnitude of the signal obtained from the audio source 10. In the embodiment to be described hereinafter, the encoder includes an addressable memory which receives addresses from an analog-to-digital converter and each address provides an output pattern of turn on signals for turning on selected modules M1 through M(n) in accordance with the magnitude of the analog signal provided by the audio source 10. As will be brought out hereinafter, the number of turn on signals provided by the encoder may need to be changed depending upon whether one or more of the modules has failed. In such case, the memory is rewritten to provide a different number of turn on signals than that which would have been the case had all of the modules operated properly.

Figure 3:
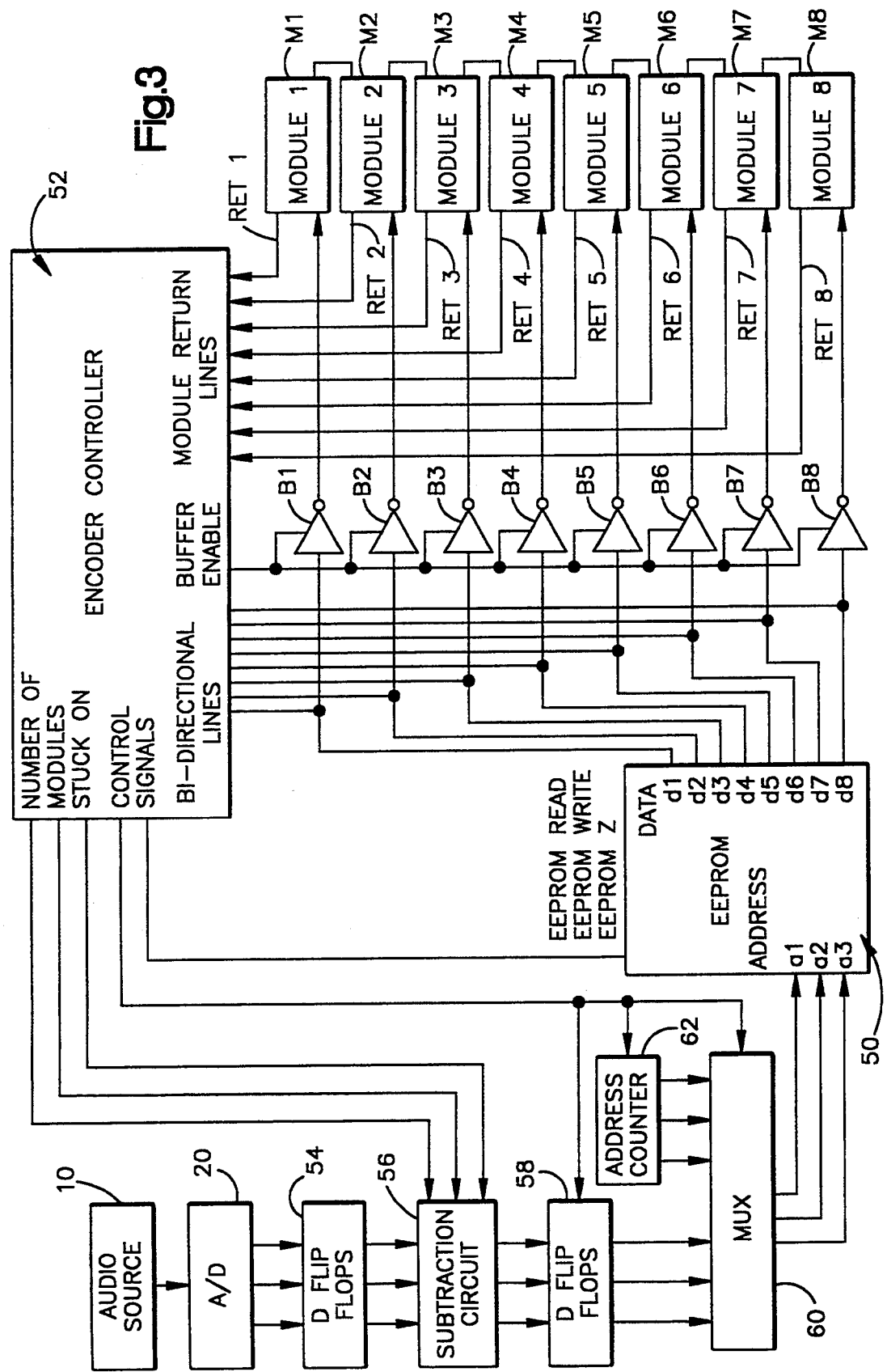
FIG. 3 is a schematic-block diagram illustration of a pulse step modulator incorporating the present invention.

Reference is now made to FIG. 3 which illustrates an embodiment of the invention in accordance with the present invention wherein the encoder includes an addressable memory 50. This memory preferably takes the form of an electrically erasable programmable read only memory (EEPROM). This memory has addressable inputs a1, a2 and a3 and has data input/output lines d1 through d8. The data lines are bi-directional lines and are connected to encoder controller 52. As will be described in greater detail hereinafter, the encoder controller 52 is coupled to the modules, in this case modules M1 through M8 (only eight modules are shown for simplicity in this explanation). The encoder controller keeps track of the number of modules that are stuck on. The number of modules that are to be turned on is provided at the output of the analog-to-digital converter 20. These outputs are applied through a set of D-type flip-flops 54 and thence to a subtraction circuit 56. As will be brought out hereinafter, the subtraction circuit 56 subtracts from the number supplied by the A/D converter 20 the number of modules that are stuck on. The result is supplied through a set of D flip-flops 58 and a multiplexer 60 to the address input of the memory 50. Periodically, the memory will be rewritten or reprogrammed to reflect the number of failed modules. This will be accomplished under the control of the encoder controller 52 which will address the memory by means of an address counter 62 and write new data into selected addresses by way of the bi-directional data lines. The encoder controller senses the number of modules that are failed and serves to reprogram the memory 50 to compensate for the failed modules.

The outputs of the memory 50 are connected to the modules M1 through M8 by way of tri-state buffers B1 through B8, respectively. Whenever these buffers are enabled by the encoder controller, the output patterns obtained from the memory 50 are supplied as a pattern of turn on and turn off signals (binary 1 and binary 0 signals) to turn on selected ones of the modules. Whenever the memory 50 is being reprogrammed or rewritten, the buffers are not enabled and data is written into the memory with the data being provided on the bi-directional lines. The encoder controller 52 monitors the operation of modules 1 through 8 which respectively are provided with return lines RET1 through RET8 which connect with the encoder controller and serve to provide information as to the status of the modules.

It is to be understood that whereas only eight modules M1 through M8 are illustrated in FIG. 3, various numbers of modules may be employed in actual practice. For example, a six bit output from the analog-to-digital converter 54 may serve to operate 46 modules. This number of modules may be served by connecting together eight memories, each constructed as in the case of memory 50. The example presented herein is limited to eight modules for purposes of simplifying the description only.

In the discussions that follow, two examples are presented to illustrate the encoder mapping scheme employed herein. The first example assumes that no modules have failed and the second example assumes that two modules have failed. In the first example reference is made to Table I below.

TABLE I

| EEPROM Address | | | EEPROM Data Outputs | | | | | | | |
|---|---|---|---|---|---|---|---|---|---|---|
| a3 | a2 | a1 | d1 | d2 | d3 | d4 | d5 | d6 | d7 | d8 |
| 0 | 0 | 0 | 0 | 0 | 0 | 0 | 0 | 0 | 0 | 0 |
| 0 | 0 | 1 | 1 | 0 | 0 | 0 | 0 | 0 | 0 | 0 |
| 0 | 1 | 0 | 1 | 1 | 0 | 0 | 0 | 0 | 0 | 0 |
| 0 | 1 | 1 | 1 | 1 | 1 | 0 | 0 | 0 | 0 | 0 |
| 1 | 0 | 0 | 1 | 1 | 1 | 1 | 0 | 0 | 0 | 0 |
| 1 | 0 | 1 | 1 | 1 | 1 | 1 | 1 | 0 | 0 | 0 |
| 1 | 1 | 0 | 1 | 1 | 1 | 1 | 1 | 1 | 0 | 0 |
| 1 | 1 | 1 | 1 | 1 | 1 | 1 | 1 | 1 | 1 | 0 |

This Table shows the data stored at each of the eight addressable locations in the memory 50 with no failed modules. Thus, if the A/D converter 20 requests that four modules be turned on, four is the address of memory 50. Address four, which takes the form of the binary bit pattern 100 will produce a pattern from the memory of 11110000. Thus, at address four, turn on signals will be provided at the memory outputs d1, d2, d3, d4 and no turn on signals will be provided at the other outputs. This will cause activation of modules M1, M2, M3 and M4. Similarly, if the output of the A/D converter 20 is six, then six modules need to be turned on. Six is also used as the address for memory 50. From Table I it will be noted that the contents at address six (110) is a pattern of 11111100. Consequently, modules M1 through M6 will be turned on and modules M7 and M8 will not be turned on. It is not necessary that when six modules are required to be turned on that the first six be turned on as opposed to the last six or some other group of six.

Reference is now made to Table II which is similar to that of Table I but shows the contents of memory 50 when modules 4 and 6 have failed and the memory has been rewritten to reflect this condition.

TABLE II

| EEPROM Address | | | EEPROM Data Outputs | | | | | | | |
|---|---|---|---|---|---|---|---|---|---|---|
| a3 | a2 | a1 | d1 | d2 | d3 | d4 | d5 | d6 | d7 | d8 |
| 0 | 0 | 0 | 0 | 0 | 0 | 0 | 0 | 0 | 0 | 0 |
| 0 | 0 | 1 | 1 | 0 | 0 | 0 | 0 | 0 | 0 | 0 |
| 0 | 1 | 0 | 1 | 1 | 0 | 0 | 0 | 0 | 0 | 0 |
| 0 | 1 | 1 | 1 | 1 | 1 | 0 | 0 | 0 | 0 | 0 |
| 1 | 0 | 0 | 1 | 1 | 1 | 1 | 1 | 0 | 0 | 0 |
| 1 | 0 | 1 | 1 | 1 | 1 | 1 | 1 | 1 | 1 | 0 |
| 1 | 1 | 0 | 1 | 1 | 1 | 1 | 1 | 1 | 1 | 1 |
| 1 | 1 | 1 | 1 | 1 | 1 | 1 | 1 | 1 | 1 | 1 |

It is to be noted that the memory is rewritten regardless of whether the modules are detected as having failed in a stuck on condition or a stuck off condition.

Assume that both modules 4 and 6 are stuck off. If the output from the A/D converter 20 requests that five modules be turned on, then this information is supplied to the subtractor circuit 56 with the other input to the subtractor being zero, since no modules are stuck on. The address to the memory is 5 (101) resulting in a turn on signal pattern of 11111110. The "1" at data output D4 cannot turn on module 4 since module 4 is broke. Also, the "1" at data output 6 cannot turn on module 6. The result is that five modules (modules M1, M2, M3, M5 and M7) will be turned on.

Assume that modules M4 and M6 are stuck on. Again, the output from the A/D converter 20 is five, requesting that five modules be turned on. Since the number of modules that are stuck on are two, the encoder controller 52 supplies that information to the subtraction circuit 56 which provides an output of three, requesting that only three modules be turned on. The address of three (011) is then supplied to the memory 50 by way of the multiplexer 60. The turn on pattern stored at address 3 in table II is 11100000. Consequently, modules M1, M2 and M3 are turned on. However, since modules M4 and M6 are stuck on, a total of five modules are on.

Assume that module M4 is stuck off and that module M6 is stuck on. Also, assume that the output of the A/D converter 20 is requesting that five modules be turned on and, accordingly, this number is supplied to the subtraction circuit 56. The other input to the subtraction circuit is "1", since only one of the failed modules is stuck on. The difference of four serves as the output of the subtraction circuit 56 and this is supplied through the D flip-flops 58 and the multiplexer 60 to the address inputs a1, a2 and a3 of memory 50. The contents of the memory 50 at address 4 (100) is (from Table II) 11111000. Module M4 is stuck off and module 6 is stuck on. Consequently, a total of five modules are on. This includes modules M1, M2, M3, M5 and M6. It is to be noted that failed modules will limit the dynamic range of the amplifier, but the encoding scheme discussed hereinabove will compensate for distortions which would otherwise occur, as is discussed hereinbefore with respect to FIG. 2B.

Encoder Controller

The encoder controller 52 includes circuitry, to be described in greater detail hereinafter, that senses a failed module and then rewrites the memory 50 to compensate for the failed module or modules. Thus, if modules 4 and 6 fail, then the memory would be rewritten from that as illustrated in Table I to that as illustrated in Table II discussed hereinabove.

The encoder controller 52 (FIG. 3) includes various discrete logic gates and has three modes of operation including a normal mode, a module check mode, and a memory write mode. In the normal mode, the data outputs from the memory 50 are used to turn the various modules M1 through M8 on. During this mode of operation, the tri-state buffers B1 through B8 are enabled, permitting the turn on signals from the memory 50 to be supplied through the buffers to the appropriate modules. The memory 50 is set to read in this mode of operation and data from the A/D converter 20 is latched in the D flip-flops 54 and the data output from the subtraction circuit 56 is latched in the D flip-flops 58 and then supplied as an address to the multiplexer 60 to the address inputs of the memory 50. The encoder controller includes circuitry that monitors the return lines RET1 through RET8 from the modules M1 through M8, respectively, to determine whether the modules are operating properly.

If the encoder controller senses an error from the status of the return line RET1 through RET8, it then goes into a module check mode, to be described in greater detail hereinafter. In this mode, the memory 50 is set so that the output lines are in a high impedance (Z) state. The tri-state buffers B1 through B8 are enabled. The encoder controller 52 sends data by way of the bi-directional lines to sequentially turn on the modules M1 through M8. The modules then send return signals to the controller on lines RET1 through RET8 and the controller determines which modules have failed and whether a failed module is stuck on or stuck off. The controller 52 then uses this information to reprogram memory 50.

Thereafter, the controller operates in a memory write mode. In this mode, the tri-state buffers B1 through B8 are disabled so that the modules M1 through M8 will not be turned on while the memory 50 is being rewritten. During this mode, the address for memory 50 is obtained from the address counter 62 controlled by controller 52. This address is supplied through the multiplexer 60, also controlled by the controller 52, with the address then being supplied to the memory 50. The data obtained from the bi-directional lines of controller 52 is then supplied to the memory at the selected address and written into the memory. After the memory 50 has been rewritten as described, the controller reverts to the normal mode of operation.

Return Signals

The return signals on return lines RET1 through RET8 from modules M1 through M8, respectively, are supplied to the controller which then determines the number of modules that are disabled and whether a disabled module is stuck on or stuck off. The return information may be representative of a stuck on condition, a stuck off condition or that the module is working correctly. The three conditions are illustrated in FIG. 4 (which includes FIGS. 4A, 4B and 4C).

Figure 4A:
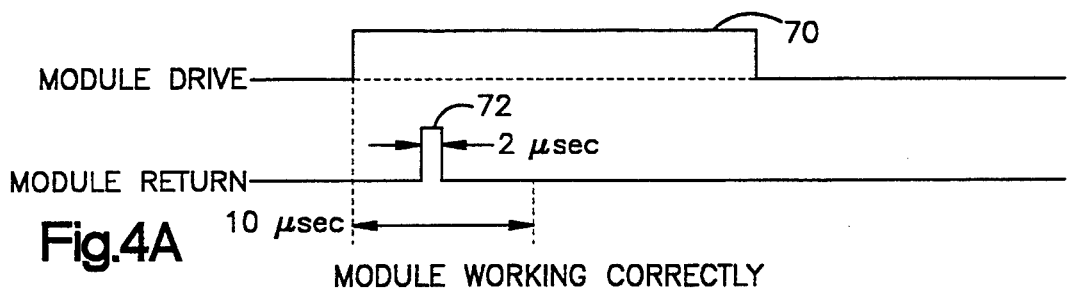
FIG. 4 includes FIGS. 4A, 4B and 4C which are graphical waveforms of voltage with respect to time useful in explaining the invention.

As shown in FIG. 4A, the module drive signal 70 provided by the controller to each of the modules M1 through M8 takes the form of a positive voltage having a duration on the order of approximately 20 microseconds. If the module receiving such a drive signal is working correctly, then it will send a return signal 72, which may have a duration on the order of 2 microseconds, to the encoder controller. This return signal will take place within a time period of approximately 10 microseconds from the commencement of the drive signal 70.

Figure 4B:
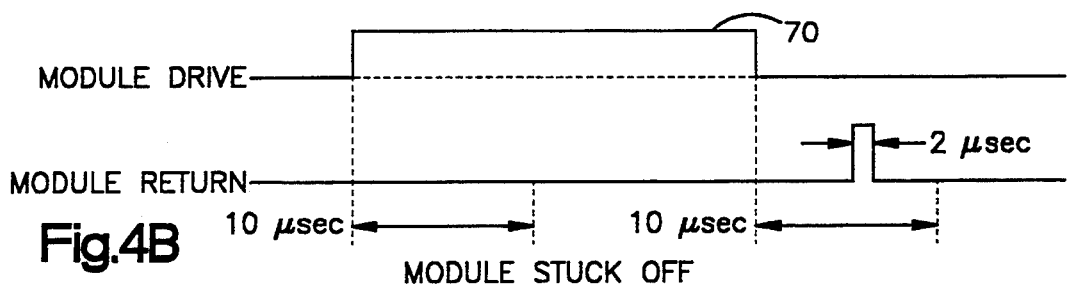

Reference is now made to FIG. 4B which shows the signal conditions when a module is stuck off. When the module drive lines goes HIGH, as indicated by signal 70, there is no return pulse. This indicates to the controller that the module is broken. After the drive signal 70 goes LOW, then a pulse on the order of 2 microseconds may take place within the next 10 microseconds. This tells the controller that the module is stuck off.

Figure 4C:
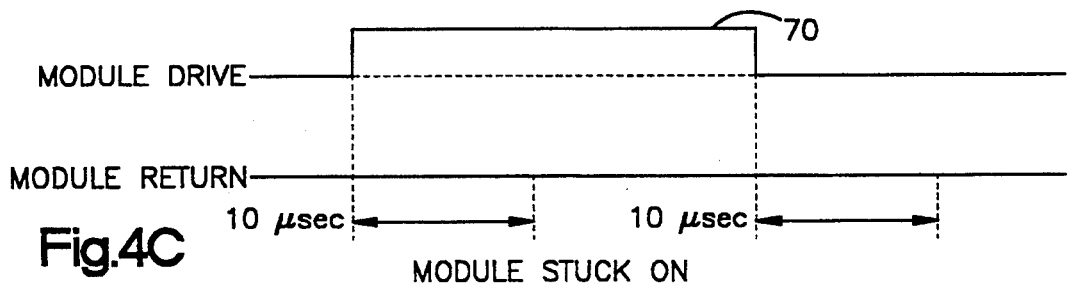

Reference is now made to FIG. 4C which shows the return signal condition when a module is stuck on. During the period that the drive signal 70 is HIGH, there is no return signal, such as in the case of the example with reference to FIG. 4A. As before, this tells the controller that the module is broken. After the module drive signal 70 goes LOW, no pulse occurs during the next 10 microseconds. This tells the controller that the broken module is stuck on.

Encoder Controller

Figure 5:
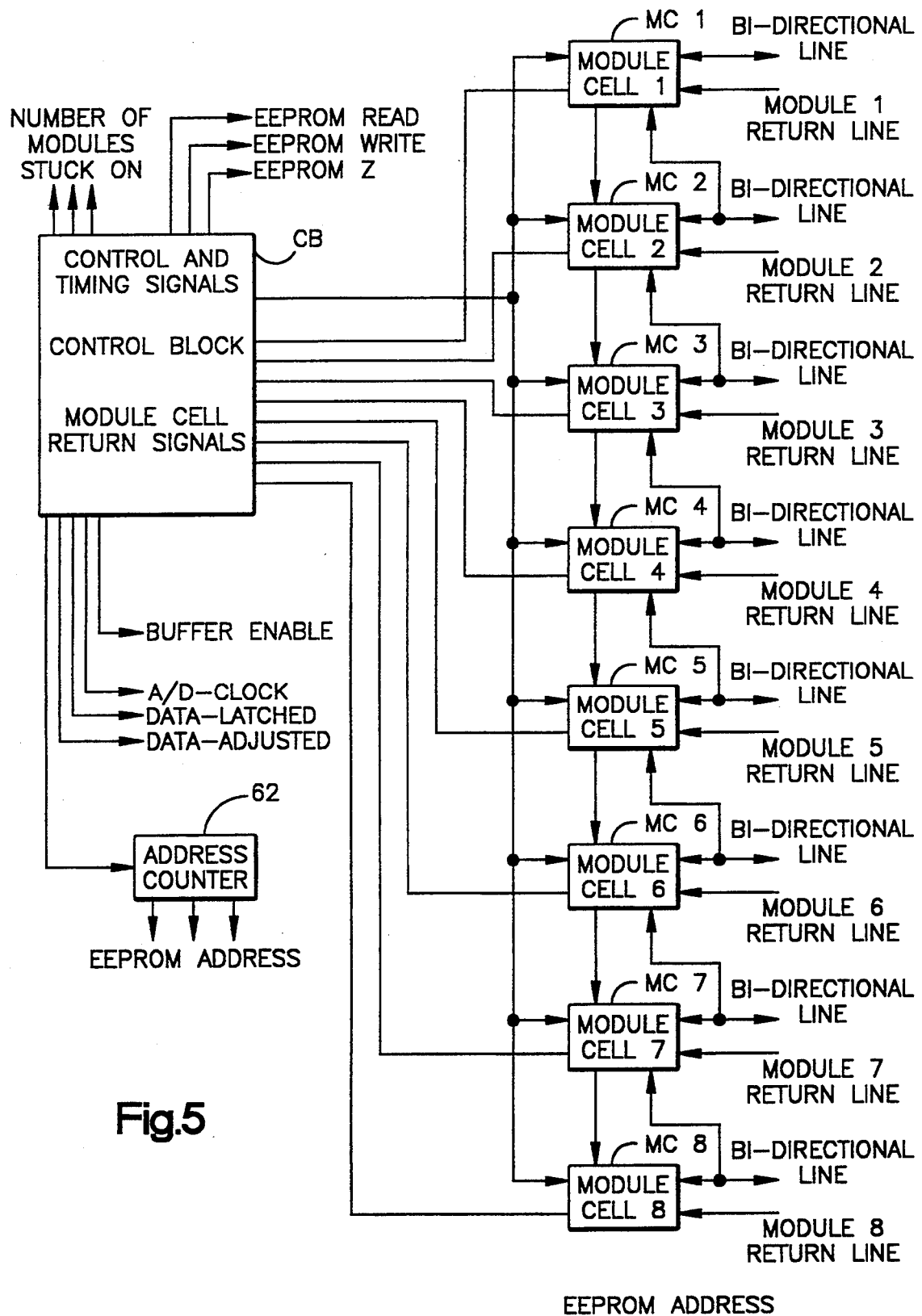
FIG. 5 is a schematic-block diagram illustration showing the encoder controller of FIG. 3 in greater detail.

The encoder controller 52 for an eight module system as described herein, takes the form as shown in FIG. 5. The timing and control signals discussed hereinbefore are provided by a control block CB which is interconnected with a plurality of module cells MC1 through MC8. Each module cell MC1 through MC8 is associated with a respective one of the modules M1 through M8 described hereinbefore with reference to FIG. 3. Each module cell keeps track of the workings of its associated module and reports this information to the control block CB. The control block CB generates the control and timing signals that are sent to each of the module cells as well as those that are sent to other circuits in FIG. 3 including memory 50.

The control block CB also sends out the EEPROM read, the EEPROM write, and the EEPROM Z signals to control the memory 50. A buffer enable line is connected to each of the buffers B1 through B8 and serves, when HIGH, to enable the various buffers. One output of the control block is supplied to the address counter 62 (see FIG. 3) which is used to provide the addresses for the memory 50 when the memory is being rewritten. The A/D-CLOCK pulse provided by the control block CB is supplied to the A/D converter 20 to start the data conversion in a conventional manner. The DATA LATCHED pulse provided by the control block CB is a pulse that is employed for latching the output of the A/D converter 20 in the D flip-flops 54 in a conventional manner. The DATA ADJUSTED pulse provided by the control block CB is a pulse that is employed for latching the data from the subtraction circuit 56 into the D flip-flops 58 in a conventional manner. This is the data that is then employed for driving the memory 50. The control block CB includes a counter which is used to count all of the return line signals that indicate that a module has been stuck on. The output from this counter provides the number of modules stuck on signal as a count to the subtraction circuit 56.

In accordance with the present invention, each of the modules M1 through M8 employs fault detecting means for detecting whether the module has failed and, if so, whether the module failed as being stuck off or being stuck on. Circuitry to accomplish this is illustrated in FIG. 6 to which reference is now made.

Figure 6:
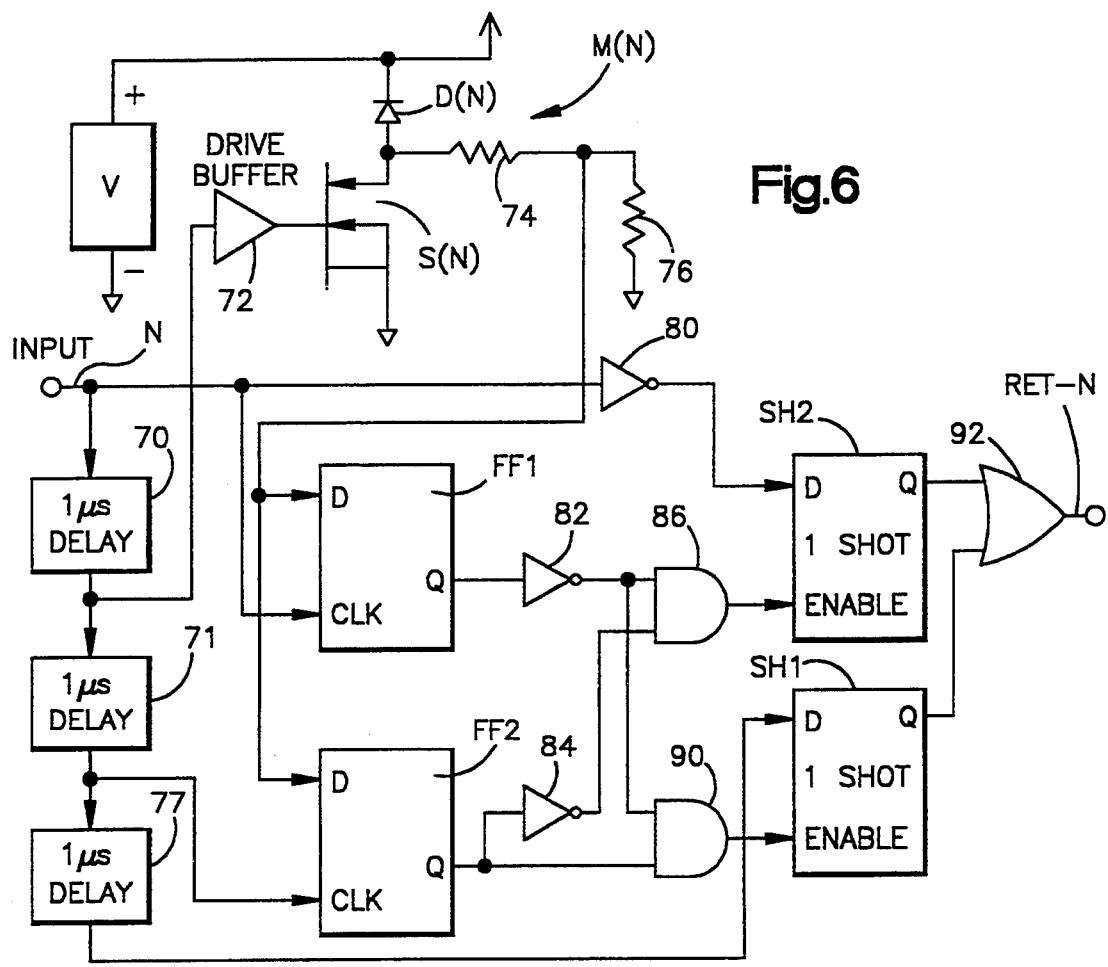
FIG. 6 is a schematic-block diagram illustration of a fault detection circuit employed in the invention.
Figure 7:
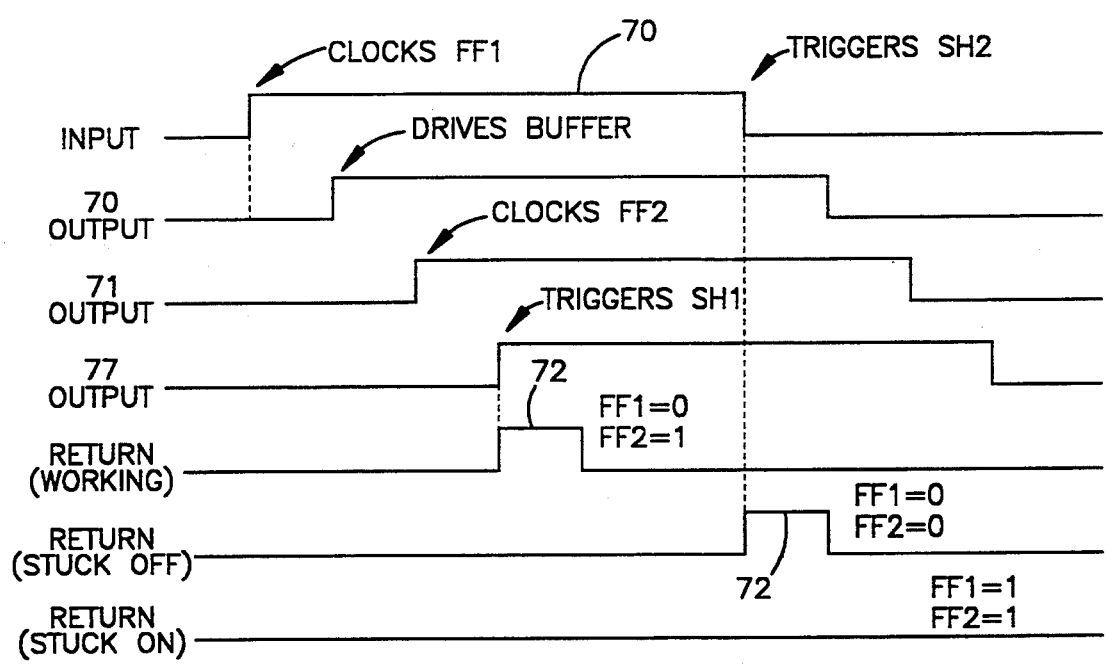
FIG. 7 includes graphical waveforms of voltage with respect to time useful in explaining the invention.

Each fault detector takes the form as that illustrated in FIG. 6 and this fault detector is connected to one of the step modules M(n). In this module, the switch S(n) is illustrated as being a semiconductor switch and which receives its control input from a control line N taken from the encoder controller 52 by way of one of the buffer amplifiers. This control line N applies a drive input or turn on signal as a positive or binary 1 signal to a one microsecond delay circuit 69 and thence through a drive buffer 73 to the switch S(n). This drive input 70 also clocks a flip-flop FF1, as shown in FIG. 7. When the transistor switch is turned on, a unit step voltage V appears across a voltage divider including resistors 74 and 76. The junction of this voltage divider is connected to the D inputs of flip-flops FF1 and FF2. The delay drive to the switch S(n) is also delayed by delay circuit 71 and serves to clock flip-flop FF2. The delayed output from circuit 71 is supplied through a delay 77 which serves to clock a one-shot circuit SH1. The input is also inverted by an inverter amplifier 80 and supplied to the clock input of a second one-shot circuit SH2. The Q outputs of flip-flops FF1 and FF2 are supplied through inverter amplifiers 82 and 84 to an AND gate 86 which supplies an enabling signal to the enable input of the one-shot circuit SH2. The inverted output from inverter amplifier 82 and the non-inverted output from the Q output of flip-flop FF2 are supplied to an AND gate 90 the output of which is supplied to an enable input of the one-shot circuit SH1. The Q outputs of one-shot circuits SH1 and SH2 are applied to an OR gate 92 to provide the return signal to the encoder controller by way of the appropriate return lines RET1 through RET8.

Each of the one-shots SH1 and SH2 will provide a 2 microsecond return pulse when the circuit has been enabled and receives a clock pulse. Considering FIGS. 4 and 7, it will be noted that when the module drive signal 70 is on and the module is working properly, then the return pulse 72 will take place within the first 10 microseconds after the drive signal 70 goes positive. Also, if the module is stuck off (see FIG. 4B) the return pulse 72 will take place after the drive signal 70 goes low. When the module is working properly, the output of flip-flop FF1 will be zero and the output of flip-flop FF2 will be 1. If the module is not working properly but is stuck off, then the output of flip-flop FF1 will be zero and the output of flip-flop FF2 will be zero. Also, if the module is stuck on, then the outputs of both flip-flops FF1 and FF2 will be 1. Stated otherwise, the output of flip-flop FF1 is zero if the module is stuck off or is working. Also, the output of flip-flop FF1 will be 1 if the module is stuck on. Similarly, if the output of flip-flop FF2 is one, then the module is working or is stuck on. If the output of flip-flop FF2 is zero, then the module is stuck off.

Module Cells

The module cells MC1 through MC 8 serve four functions. They are used to determine if the modules are working correctly, to keep track of a broken module, to determine if a module is stuck on or off and to rewrite the memory 50. The module cells are interconnected, as shown in FIG. 5, and the module return line from each of the modules M1 through M8 is connected to its associated module cell, as will be described in greater detail hereinafter. The bi-directional lines connected to each module cell are used for monitoring the outputs of the memory 50 and also for turning on the various modules M1 through M8 and also for writing data to be stored in the memory. The bi-directional line associated with each module cell is also connected to the immediately preceding module cell.

Module Cell

Figure 8:
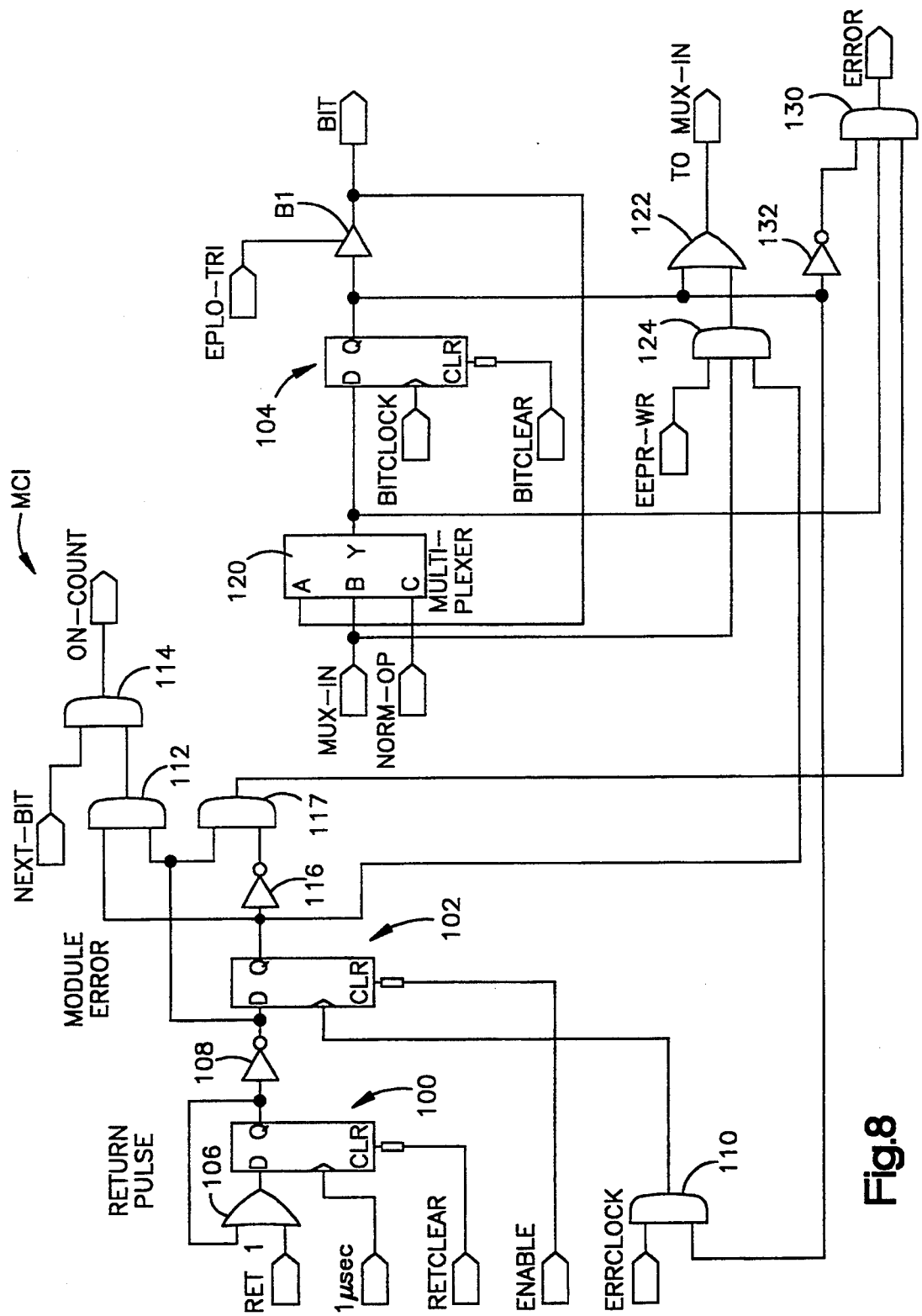
FIG. 8 is a schematic-block diagram illustration illustrating a module cell employed in the encoder controller of FIG. 5.

Each of the module cells MC1 through MC8 takes the form of the module cell MC1 shown in FIG. 8. That module cell includes three D-type flip-flops including a return pulse flip-flop 100, a module error flip-flop 102 and a module flip-flop 104.

The return pulse flip-flop 100 is used to receive the 2 microsecond return pulse from the module over the input line RET1. The 1USEC line serves as the clock input for this flip-flop. The RETCLEAR input is used to clear the flip-flop. The output from the Q output terminal of the flip-flop is fed back to the D input terminal of the flip-flop by way of an OR gate 106. The Q output terminal of flip-flop 100 is supplied by way of an inverter amplifier 108 to the D input of the module error D flip-flop 102. This flip-flop is set to a one when the module associated with the flip-flop has failed (to be described in greater detail hereinafter). An ERR-CLOCK signal pulse is applied through an AND gate 110 serves as the clock for this flip-flop. The flip-flop is cleared by a pulse applied to its ENABLE input. The output of the inverter amplifier 108 is also supplied to one input of an AND gate 112 and to one input of an AND gate 117. The other input to AND gate 112 is obtained from the Q output of flip-flop 102. The other input to AND gate 117 is obtained from the Q output of flip-flop 102 by way of an inverter amplifier 116. The output of AND gate 112 serves as one input to an AND gate 114 having its second input obtained from a NEXT-BIT input. The output of the AND gate 114 appears on an output line ON-COUNT (to be described in greater detail hereinafter).

The module D flip-flop 104 has three functions. First, during a normal mode it keeps track of the previous value of a module. Second, during a module check mode, the tri-state buffer is enabled and the module D flip-flop is used to turn a module on or off. Third, during the EEPROM write mode, the tri-state buffer is again enabled, and the module D flip-flop is used to write data into the memory 50. The module D flip-flop 104 has a multiplexer 120 associated therewith and the output of the multiplexer is supplied to the D input of flip-flop 104. The clock for this flip-flop is obtained from a BIT CLOCK input. The clear for this flip-flop is obtained from a BIT CLEAR input. The multiplexer has an input obtained from a MUX-IN input which is supplied to the B input and a control signal is applied to the S input from a NORM-OP line. The A input of the multiplexer is taken from the output of a buffer B1. This buffer is enabled by a positive pulse on its EPLO-TRI input. The Q output of flip-flop 104 is also supplied to one input of an OR gate 122 having a second input obtained from an AND gate 124. This AND gate has an input obtained from the EEPR-WR line and a second input from the MUX-IN line and a third input from the Q output of flip-flop 102.

The Q output of flip-flop 104 is also supplied to one input of an AND gate 130 by way of an inverter amplifier 132. A second input to this AND gate is obtained from the output of multiplexer 120 and a third input to the AND gate is obtained from the output of AND gate 117. The output of the AND gate 130 is the ERROR output line which supplies information to the control block as to the condition of the associated module.

Modes of Operation

Normal Mode

When the encoder controller 52 is in the normal mode of operation, it is searching for the occurrence of a failed module. Reference is now made to FIG. 9 which presents waveforms showing timing signals that are provided by the control block CB (FIG. 5) as well as the data that is obtained from the A/D converter 20. This information may be viewed in light of FIG. 10 which shows the signal path from the A/D converter 20 to the memory 50 during this mode of operation. The signal A/D CLOCK is a negative pulse that is supplied to the A/D converter 20 and occurs every 20 microseconds. The data appearing on the A/D DATA lines is valid after 15 microseconds from the occurrence of the A/D CLOCK. A DATA LATCHED pulse is provided during the valid data period and this is supplied to the D flip-flops 54A, 54B and 54C (making up the D flip-flop 54 in FIG. 3) so that the data from the A/D converter 20 can be latched into the flip-flops. This data is then supplied to the subtraction circuit 56 where the number of modules that are stuck on is subtracted from the number of modules that are to be turned on, as obtained from the A/D converter 20. This difference is then latched into the D flip-flops 58A, 58B, and 58C (making up the D flip-flop 58 of FIG. 3) under control of a DATA-ADJUSTED pulse supplied to the D flip-flop 58 from the controller 52. The output from the latched flip-flop 58 is now supplied to the memory 50 to obtain the turn on pattern for turning on the modules.

Figure 11:
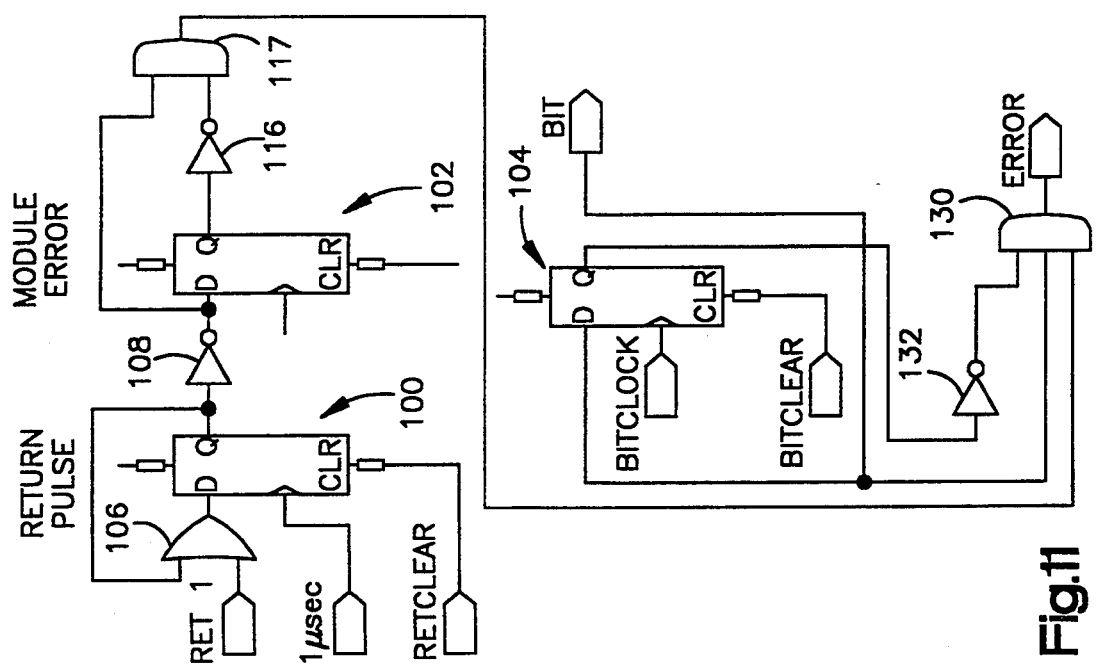
FIG. 11 is a schematic-block diagram showing a portion of the module cell of FIG. 6 which is used during the normal mode of operation.

Reference is now made to FIG. 11 which shows only those portions of the module cell of FIG. 8 that are employed during a normal mode of operation. The BIT line is connected to the associated EEPROM line. The module D flip-flop 104 stores the previous state of the module. If line BIT is one and the module D flip-flop 104 has an output of zero, then the module was just turned on. The RETURN PULSE flip-flop 100 is zero if its input line RET1 did not have a 2 microsecond return pulse. The module error D flip-flop 102 is at a zero state if the module has not failed. This condition will cause the signal ERROR at the output of AND gate 130 to be at a binary 1 level. The ERROR-CHECK pulse in FIG. 9 occurs 11 microseconds after the modules are turned on. This tells the control block CB that all of the return pulses from the modules should have occurred. If an error is detected, the control block will go into a module check mode of operation.

The return pulse flip-flop 100 will have a binary 1 status if a return pulse occurred during the proper period (see FIG. 4A). This will cause the module error flip-flop 102 to be at a binary 0 status. The state of the module is then stored in the module D flip-flop 104. The signal BIT CLOCK is a clock input to the flip-flop 104 so that it stores the value of the BIT line. In this manner, the encoder controller knows whether the module being examined is being turned on in the next clock period. If a module stays on from one clock period to the next, a return pulse is not expected. The signal RET-CLEAR provided by the control block serves to clear the return flip-flop 100.

Module Check Mode

Figure 12:
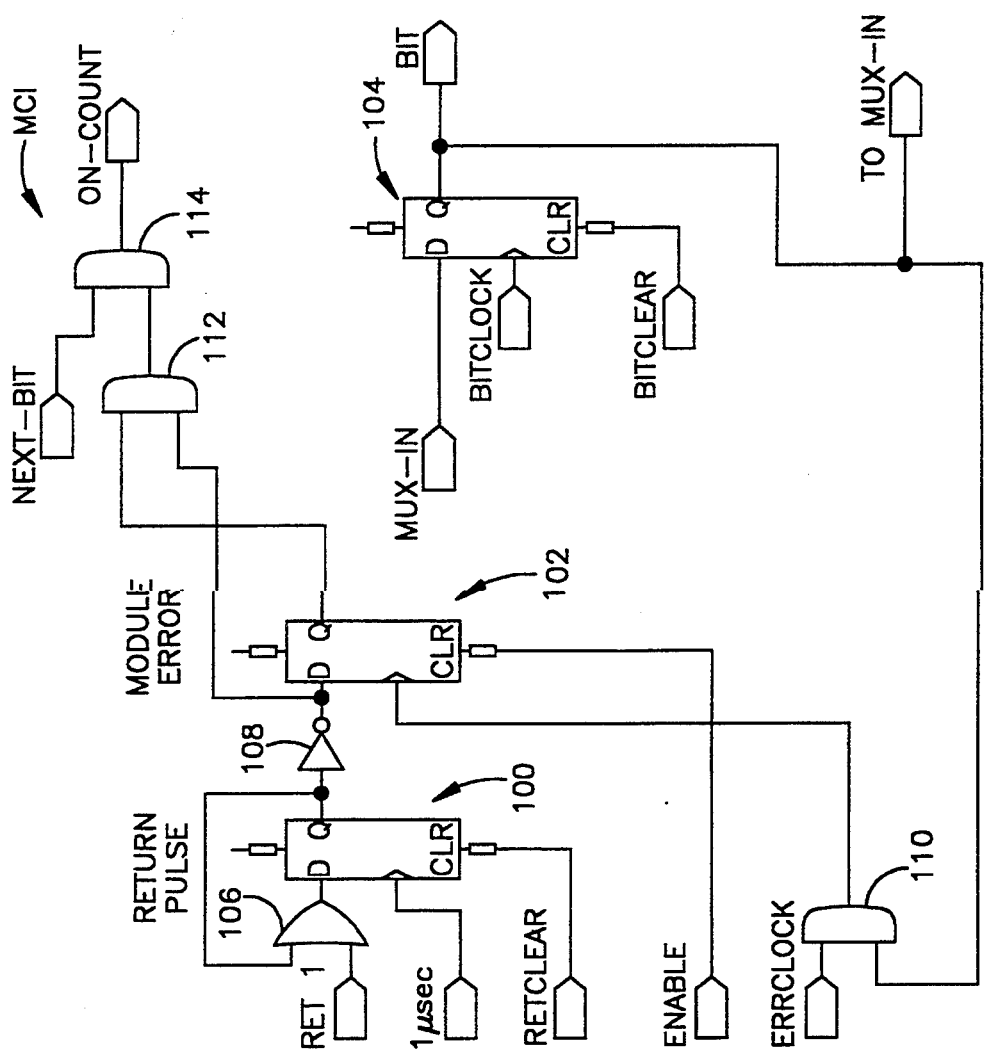
FIG. 12 is a schematic diagram showing a portion of the module cell during the module check mode of operation.
Figure 13:
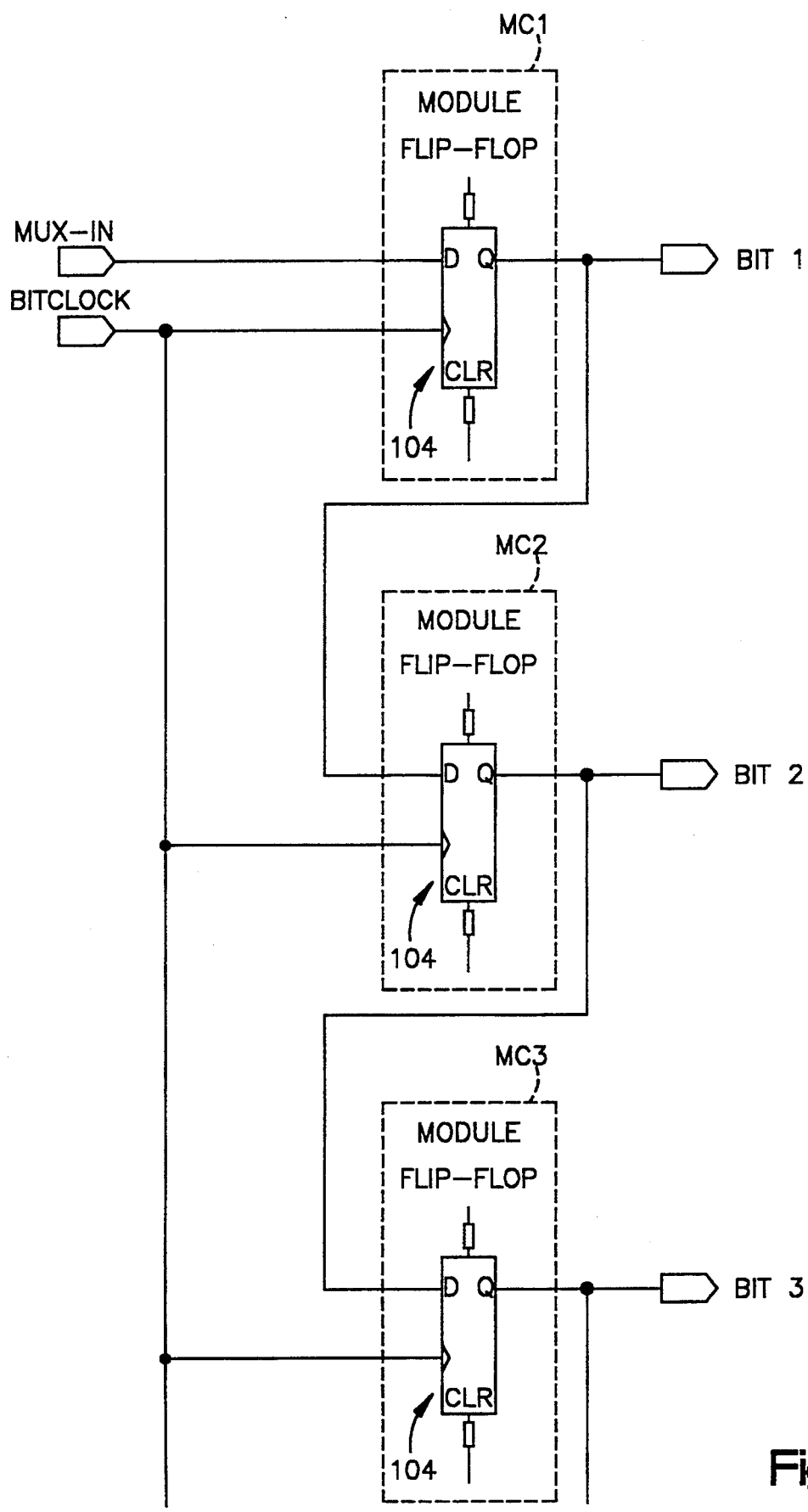
FIG. 13 is a schematic-block diagram illustration that shows the manner in which the module D flip-flops of the various module cells are interconnected during a module check mode of operation.

Reference is now made to FIG. 12 which shows a portion of the module cell of FIG. 8 that is employed during the module check mode of operation. When the encoder controller 52 detects an error, it checks each module to find the modules that are not working. FIG. 13 shows the manner in which the module cells are interconnected during this mode of operation. Thus, the module cells are interconnected in a stacked configuration with the BIT output from flip-flop 104 of each module being connected to the MUX-IN input of the next module and so on. The BIT CLOCK pulse is supplied to the clock input of each of the module flip-flops 104 in this stacked configuration.

Figure 14:
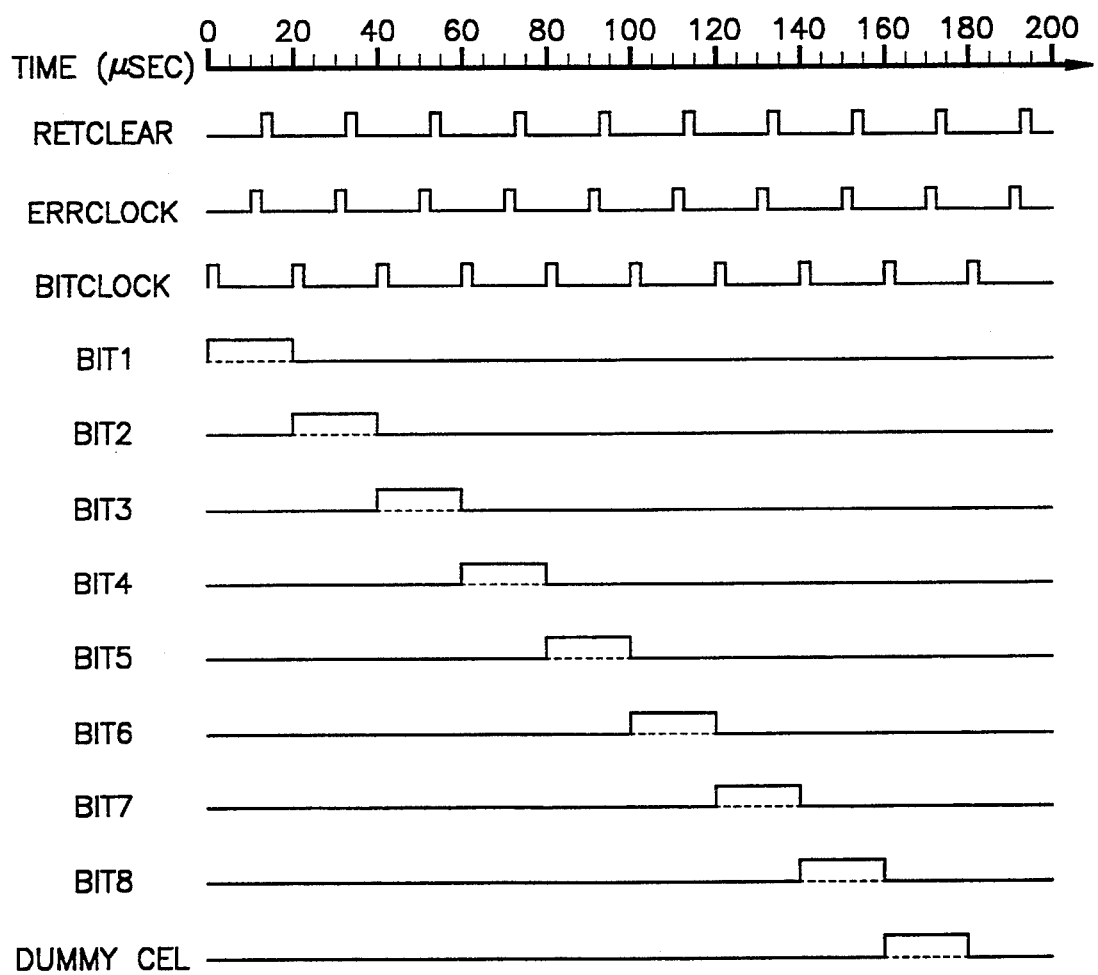
FIG. 14 includes graphical waveforms of voltage with respect to time useful in explaining the invention herein.

FIG. 14 is a graphical illustration of the timing signals provided by the control block CB during this mode of operation. BIT1 is the output of the module flip-flop 104 of module cell MC1. BIT2 is the output of the module flip-flop 104 of module cell MC2. The BIT1 pulse is used to turn on the first module M1. The BIT2 pulse is used to turn on the second module M2 and so. If module M1 is working, then it will send a return pulse back to the module cell MC1 after it has been turned on. This has been discussed hereinbefore with reference to the waveforms in FIGS. 4 and 7. A proper return pulse will set the return pulse flip-flop 100 in the associated module cell MC1 to a binary 1 level. The ERRCLOCK pulse (see FIG. 14) is supplied to the clock input of flip-flop 102 and, since the one output of flip-flop 100 is inverted by inverter amplifier 108, the flip-flop 102 will now be set so that its Q output is at a binary 0 level. This indicates that no error has taken place in module M1.

If module M1 is not working, then there will be no return pulse during the existence of the module drive signal (see FIGS. 4 and 7) and hence the return pulse flip-flop 100 in module MC1 will be set to a binary 0 level. This will cause the Q output of the module error flip-flop 102 to be at a binary 1 level. This indicates that a failure has taken place at module M1.

If a failure occurs in module M1, the type of failure that occurs will be determined while the next module, i.e., module M2, is turned on. In FIG. 12, the NEXT-BIT input is HIGH when module M2 is turned on. That is, the BIT output of module M1 is connected to the NEXT BIT input of the previous module, etc. If a return pulse occurs on line RET1 after module 1 is turned off, it means that module M1 is stuck off (see FIGS. 4 and 7). This causes the Q output of the return pulse flip flop 100 in module cell MC-1 to be at a binary 1 level. Since this is inverted by inverter amplifier 108, the ON-COUNT output of AND gate 114 will be 0. If no return pulse occurs on line RET1 after module M1 has been turned off this is interpreted that the module M1 is stuck on (see FIGS. 4 and 7). This will cause the Q output of the return pulse flip-flop 100 in module cell MC1 to be at a binary 0 level and the ON COUNT output of AND gate 114 will be at a binary 1 level. This indicates to the control block CB (FIG. 5) of the encoder controller that module M1 is stuck on. The ON- COUNT output lines of all of the module cells MC1 through MC8 are connected to the control block CB which includes a suitable counter for counting the number of modules that are stuck on during each sequence of interrogating the modules M1 through M8. This counter will be reset at the end of each sequence of interrogating the modules.

EEPROM Write Mode

The encoder controller 52 (FIG. 3) will rewrite the memory 50 in order to compensate for the failed modules. The data to be written into the memory 50 is obtained from the bi-directional lines of the encoder controller 52 and that data is written into an address that is supplied to the memory from the encoder controller 52 by way of the address counter 62 and the multiplexer 60. The encoder controller, during this operation, will disable the buffers B1 through B8 and will raise its EEPROM write signal which causes the data to be written into the memory at the addressed locations.

Figure 15:
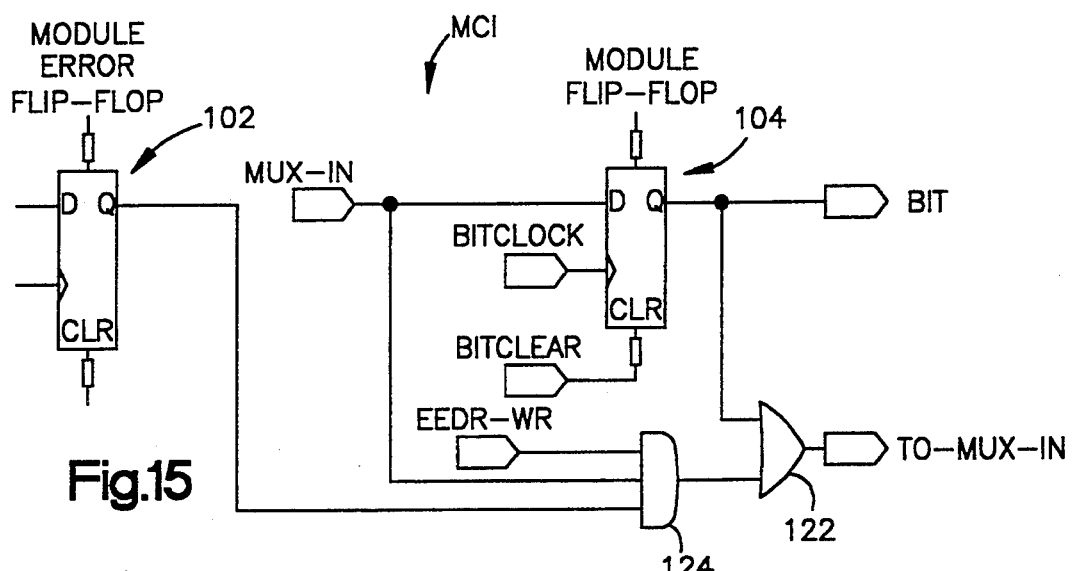
FIG. 15 is a schematic-block diagram illustrating a portion of the module cell operation during the EEPROM write mode of operation.
Figure 16:
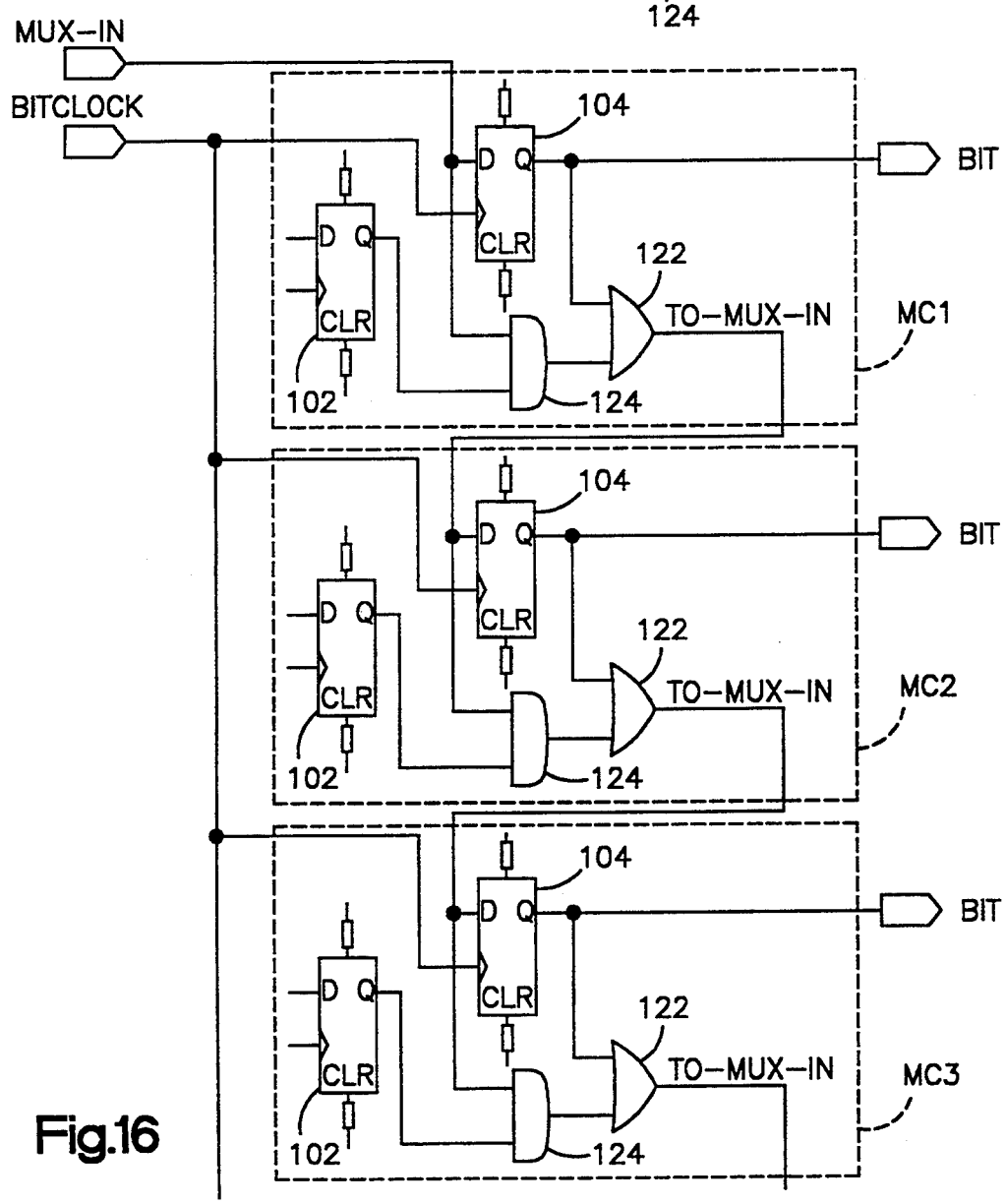
FIG. 16 illustrates the manner in which the module D flip-flops are interconnected during the EEPROM write mode of operation.
Figure 17:
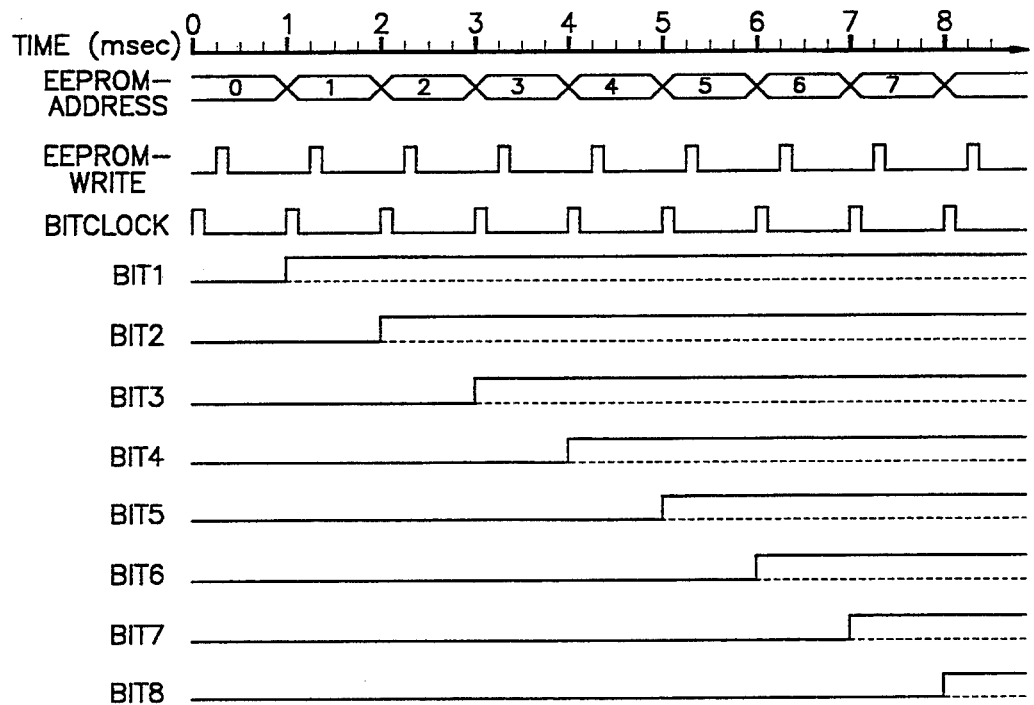
FIG. 17 includes graphical waveforms of voltage with respect to time useful in describing the portion of the invention relating to the EEPROM write mode of operation with no failed modules.

Reference is now made to FIG. 15 which illustrates that portion of the module cell MC1 that is used during the write mode of operation. The output TO-MUX-IN of FIG. 15 is connected to the MUX-IN of the next module cell MC2. This is shown in FIG. 16 wherein module cells MC1, MC2, MC3 are connected in a stacked configuration (it being understood that the remaining modules are also connected in the same manner). The input to the MUX-IN line of the first module cell MC1 is set by the control block CB. The write timing signals for the memory 50 for this mode of operation are obtained from the control block CB and are illustrated in FIG. 17 for the mode of operation when no modules have failed. Initially, the output signal level of the BIT1 line of the module cell MC1 is LOW. With the requested address being 0, then the output of all eight modules (BIT1 through BIT8) is 0. Therefore, when an EEPROM-WRITE pulse occurs, the number 00000000 is written into the memory at address 0. This takes less than a millisecond to accomplish. Next, the MUX-IN line to module cell MC1 goes HIGH. Consequently, a BITCLOCK pulse occurs and sets BIT1 line to 1 (HIGH). At this point, the address requested is address 1. Hence, as EEPROM-WRITE pulse causes the number 10000000 to be written into the memory at address 1. The next BIT CLOCK pulse causes the BIT2 line to go HIGH. Since the address requested is address 2, the pattern 11000000 is written into the memory at address 2. This process will continue until all eight addresses in the memory 50 have been written. The contents of the memory when this is completed takes the form as shown in Table I for each of the addresses.

Figure 18:
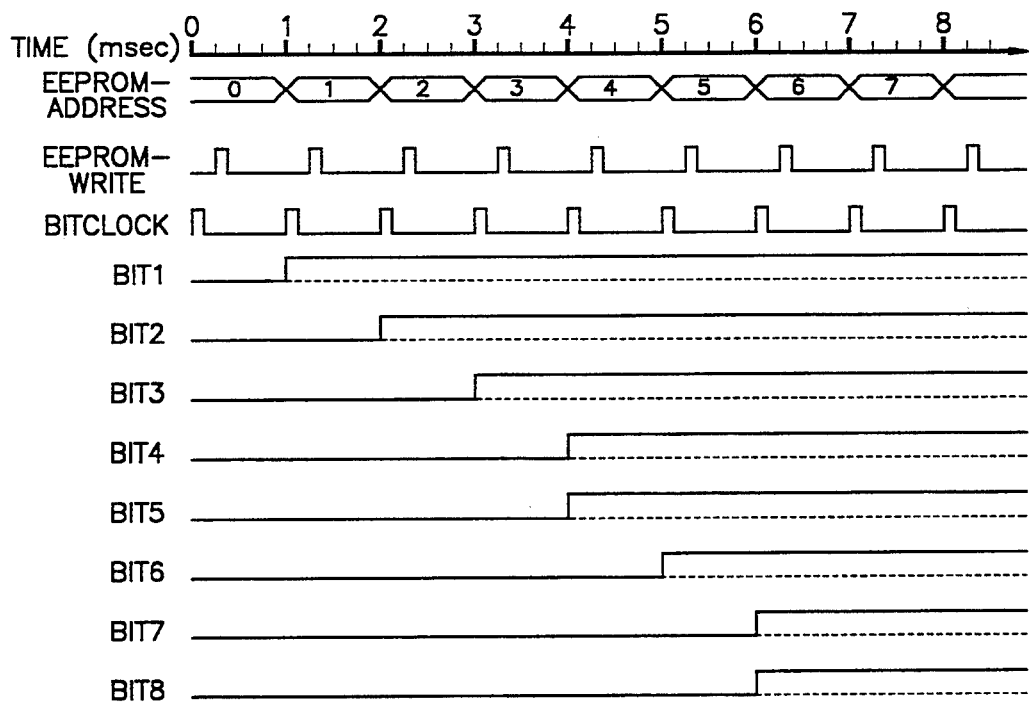
FIG. 18 includes graphical waveforms of voltage with respect to time useful in explaining the operation of the EEPROM write mode of operation when there are two failed modules.

If some of the modules M1 through M8 have failed, the data that is written into the memory 50 must compensate for the failed modules. Assume that modules 4 and 6 have failed. Consequently, the MODULE ERROR flip-flop 102 of module cells MC4 and MC6 have their Q outputs set to a binary 1 level before the memory write process begins. This process is illustrated in FIG. 18. Reference will now be made for the discussion that follows to both the timing signals in FIG. 18 for two failed modules as well as to the data stored in the memory as shown in Table II.

When the first EEPROM-WRITE pulse occurs, 0 (i.e., 00000000) is again written into the memory address 0 because all of the lines BIT1 through BIT8 are low. The MUX-IN line of module cell 1 goes HIGH and a BIT CLOCK pulse occurs. This sets BIT1 line to a binary level of 1. Consequently, then, EEPROM-WRITE pulse writes 10000000 into the memory address 1 because the only bit line that has been raised is BIT1 line. The next BIT CLOCK pulse sets line BIT2 to 1 and 1100 0000 is written into the memory address 2. After the next BIT CLOCK pulse, a binary pattern of 11100000 is written into the memory address 3. The next BIT CLOCK pulse sets both BIT4 and BIT5 lines to a binary 1 level. The BIT5 line is set to a binary 1 level because the module MC has failed. The MODULE ERROR flip-flop 102 of module cell MC4 is 1. This is illustrated in FIG. 15 which shows the circuitry in operation when the module is operating during the MEMORY WRITE mode. The EEPROM-WR (EEPROM-WRITE) signal is at a binary 1 level when in the EEPROM-WRITE mode of operation. With the module error flip-flop 102 having its Q output at a binary 1 level, the signal on the MUX-IN line will propagate to the next module cell. The result in the case being described is that the bit pattern 11111000 is written into the memory address 4. This process continues until all of the memory addresses have been written. The contents of the memory are as shown in Table II. The encoder will now revert to its normal operation of monitoring the modules M1 through M8 in the eight module example being described.

Whereas the invention has been described in conjunction with a particular embodiment, it is to be appreciated that various modifications will occur to those skilled in the art within the spirit and scope of the invention as defined by the appended claims.

Having described the invention, the following is claimed:

1. A pulse step modulator comprising:
   a plurality of series connected unit step modules, each including a DC voltage source and an associated actuatable switching means for, when actuated, turning on an associated said module to provide a unit step voltage;
   an output circuit connected to said series connected modules for providing an output voltage to a load wherein the magnitude of the output voltage is equal to the sum of all of the voltage sources of the modules that are turned on;
   means for providing a plurality of turn on signals, each for actuating a said switching means in one of said modules, such that the number of turn on signals is dependent upon the magnitude of an input signal;
   said turn on signal providing means including addressable memory means and addressing means;
   said addressable memory means having a plurality of addressable storage means each storing and providing, when addressed, a said plurality of turn on signals; and
   addressing means for selectively addressing one of said addressable storage means with the selected address being dependent upon the magnitude of said input signal to obtain from the address storage means a said plurality of said turn on signals.

2. A pulse step modulator comprising:
   a plurality of series connected unit step modules, each including a DC voltage source and an associated actuatable switching means for, when actuated, turning on an associated said module to provide a unit step voltage;
   an output circuit connected to said series connected modules for providing an output voltage to a load wherein the magnitude of the output voltage is equal to the sum of all of the voltage sources of the modules that are turned on;

means for providing a plurality of turn on signals, each for actuating a said switching means in one of said modules, such that the number of turn on signals is dependent upon the magnitude of an input signal;

said turn on signal providing means including addressable memory means and addressing means;

said addressable memory means having a plurality of addressable storage means each storing and providing, when addressed, a said plurality of turn on signals;

addressing means for selectively addressing one of said addressable storage means with the selected address being dependent upon the magnitude of said input signal to obtain from the addressed storage means a said plurality of said turn on signals; and means for rewriting said memory means to change the number of turn on signals stored at each of said addressable storage means.

3. A pulse step modulator as set forth in claim 2 including fault detector means for monitoring the operation of each said module for fault conditions and for providing a fault output indication representative of the number of faulted modules.

4. A pulse step modulator as set forth in claim 3 wherein said memory rewriting means includes means for rewriting said memory means to change the number of turn on signals at each said addressable storage means in dependence upon the number of faulted modules.

5. A pulse step modulator as set forth in claim 4 wherein said fault detector means includes means for determining the number of faulted modules that have faulted in an on condition and providing a faulted on indication in accordance therewith.

6. A pulse step modulator as set forth in claim 5 including combining means for combining said plurality of turn on signals with said faulted on indication to provide a modified plurality of turn on signals for use as an address for addressing said addressable memory means.

7. A pulse step modulator as set forth in claim 6 wherein said signal combining means includes subtracting means for subtracting the number represented by said faulted on indication from the number of turn on signals provided by said turn on signal providing means.

8. A pulse step modulator as set forth in claim 7 wherein said memory means functions as an encoder means and encoder controller means including means for providing a stuck on output signal representing the number of modules that have been stuck on.

9. A pulse step modulator as set forth in claim 8 wherein said fault detector means includes a plurality of fault detector circuit means each providing a stuck on signal when its associated module has faulted in a stuck on condition.

10. A pulse step modulator as set forth in claim 9 wherein said encoder controller means includes means for counting said stuck on signals to provide a stuck on indication as to the number of modules that have faulted with a stuck on condition.

11. A pulse step modulator as set forth in claim 10 wherein said encoder-controller means includes a plurality of module cells each associated with one of said unit step modules, each said module cell having an on count output for providing a said stuck on signal.

12. A modulator comprising:

a plurality of unit modules, each including a signal source and an associated actuatable switching means for, when actuated, turning on an associated said module to provide a unit signal;

an output circuit connected to said modules for providing an output signal to a load wherein the magnitude of the output signal is equal to the sum of all of the signal sources that are turned on;

means for providing a plurality of turn on signals, each for actuating a said switching means in one of said modules, such that the number of turn on signals is dependent upon the magnitude of an input signal;

said turn on signal providing means including addressable memory means and addressing means;

said addressable memory means having a plurality of addressable storage means each storing and providing, when addressed, a said plurality of turn on signals; and addressing means for selectively addressing one of said addressable storage means with the selected address being dependent upon the magnitude of said input signal to obtain from the address storage means a said plurality of said turn on signals.

13. A modulator comprising:

a plurality of unit modules, each including a signal source and an associated actuatable switching means for, when actuated, turning on an associated said module to provide a unit signal;

an output circuit connected to said modules for providing an output signal to a load wherein the magnitude of the output signal is equal to the sum of all of the signal sources that are turned on;

means for providing a plurality of turn on signals, each for actuating a said switching means in one of said modules, such that the number of turn on signals is dependent upon the magnitude of an input signal;

said turn on signal providing means including addressable memory means and addressing means;

said addressable memory means having a plurality of addressable storage means each storing and providing, when addressed, a said plurality of turn on signals;

addressing means for selectively addressing one of said addressable storage means with the selected address being dependent upon the magnitude of said input signal to obtain from the address storage means a said plurality of said turn on signals; and means for rewriting said memory means to change the number of turn on signals stored at each of said addressable storage means.

14. A modulator as set forth in claim 13 including fault detector means for monitoring the operation of each said module for fault conditions and for providing a fault output indication representative of the number of faulted modules.

15. A modulator as set forth in claim 14 wherein said memory rewriting means includes means for rewriting said memory means to change the number of turn on signals at each said addressable storage means in dependence upon the number of faulted modules.

16. A modulator as set forth in claim 15 wherein said fault detector means includes means for determining the number of faulted modules that have faulted in an on condition and providing a faulted on indication in accordance therewith.

17. A modulator as set forth in claim 16 including combining means for combining said plurality of turn on signals with said faulted on indication to provide a modified plurality of turn on signals for use as an address for addressing said addressable memory means.

18. A modulator as set forth in claim 17 wherein said signal combining means includes subtracting means for subtracting the number represented by said faulted on indication from the number of turn on signals provided by said turn on signal providing means.

19. A modulator as set forth in claim 18 wherein said memory means functions as an encoder means and encoder controller means including means for providing a stuck on output signal representing the number of modules that have been stuck on.

20. A modulator as set forth in claim 19 wherein said fault detector means includes a plurality of fault detector circuit means each providing a stuck on signal when its associated module has faulted in a stuck on condition.

21. A modulator as set forth in claim 20 wherein said encoder controller means includes means for counting said stuck on signals to provide a stuck on indication as to the number of modules that have faulted with a stuck on condition.

22. A modulator as set forth in claim 21 wherein said encoder-controller means includes a plurality of module cells each associated with one of said unit step modules, each said module cell having an on count output for providing a said stuck on signal.

* * * * *